United States Patent [19]

Arimoto

[11] Patent Number: 5,510,749
[45] Date of Patent: Apr. 23, 1996

[54] CIRCUITRY AND METHOD FOR CLAMPING A BOOST SIGNAL

[75] Inventor: Kazutami Arimoto, Hyogo, Japan

[73] Assignee: Mitsubishi Denki Kabushiki Kaisha, Tokyo, Japan

[21] Appl. No.: 130,576

[22] Filed: Oct. 1, 1993

[30] Foreign Application Priority Data

Oct. 28, 1992 [JP] Japan ................................ 4-289969

[51] Int. Cl.⁶ ............................................... H03K 3/01
[52] U.S. Cl. ...................... 327/546; 327/328; 327/332; 327/170
[58] Field of Search .................... 307/540, 296.1, 307/296.5, 296.6, 296.8, 555, 264; 365/226, 189.09, 189.11, 189.06, 327, 365

[56] References Cited

U.S. PATENT DOCUMENTS

| | | | |
|---|---|---|---|
| 4,994,689 | 2/1991 | Kikuda et al. | 307/296.5 |
| 5,189,316 | 2/1993 | Murakami et al. | 307/296.6 |
| 5,287,011 | 2/1994 | Koshikawa et al. | 307/296.1 |
| 5,287,012 | 2/1994 | Koshikawa | 307/296.1 |
| 5,305,260 | 4/1994 | Ninomiya | 365/189.09 |
| 5,329,168 | 7/1994 | Sugibayashi et al. | 307/296.6 |

OTHER PUBLICATIONS

"Dual–Operating–Voltage Scheme for a Single 5–V 16–Moit DRAM", M. Hariguchi et al., IEEE Journal of Solid State Circuit, vol. 23, No. 5, pp. 1128–1132.

Primary Examiner—Timothy P. Callahan
Assistant Examiner—My-Trang Ton
Attorney, Agent, or Firm—Lowe, Price, LeBlanc & Becker

[57] ABSTRACT

A clamping circuit clamping a boost signal supplied on a boost line includes a p-channel MOS transistor and an n-channel MOS transistor. These MOS transistors are serially connected between an internal power supply line and the boost line. p-channel MOS transistor receives a clamping level control signal from a clamp control circuit at its gate. In accordance with the clamping level control signal a clamping level given by clamping circuit is varied. Therefore, by decreasing the clamping level of the boost line during an overvoltage-applied mode such as burn-in test, deterioration of components due to an overvoltage can be prevented.

22 Claims, 11 Drawing Sheets

CIRCUITRY AND METHOD FOR CLAMPING A BOOST SIGNAL

BACKGROUND OF THE INVENTION

1. Field of the Invention

The present invention relates to structures for clamping a boost signal, and more particularly to a structure for restricting an upper limit of boosting level on a boost signal line such as a word line in a semiconductor memory device.

2. Description of the Background Art

In a semiconductor memory device using a single power supply, a power supply voltage is boosted on-chip to generate a boost signal. Such boost signals serve as a word line driving signal in a DRAM (Dynamic Random Access Memory) and a programming high voltage in EEPROM.

An entire structure of a DRAM is shown in FIG. 12. The DRAM is only an example of applications of the present invention, and the present invention is not necessarily be limited to the DRAM.

Referring to FIG. 12, the DRAM includes a memory cell array 500 in which memory cell MC are arranged in a matrix of rows and columns. In memory cell array 500, a word line WL is arranged corresponding to each row and a pair of bit lines BLP are arranged corresponding to each column. In FIG. 12, one word line WL and one pair of bit lines BLP are represented. Memory cell MC includes a capacitor 42 storing information in a form of electric charges, and a transfer gate 41 being conductive in response to a potential of a signal on word line WL to connect capacitor 42 to a corresponding bit line (BL). Transfer gate 41 is usually structured with an n-channel MOS (insulating gate-type field effect) transistor 41.

The DRAM further includes an address buffer 502 taking in an external multiple-bit address signal A0–An for generating an internal address signal; a row decoder 504 decoding an internal row address signal applied from address buffer 502 for generating a signal designating a corresponding row in memory cell array 500; and a word line driver 506 responsive to the row designating signal applied from row decoder 504 for driving a corresponding row in memory cell array 500 to the selected state. Word line driver 506 transmits a boost signal applied from a boosting circuit 508 on a selected word line (a word line designated by the row designating signal).

The DRAM further includes a column decoder 510 decoding an internal column address signal applied from address buffer 502 for generating a signal designating a corresponding column in memory cell array 500; a sense amplifier sensing and amplifying the data in a selected memory cell in memory cell array 500 (a memory cell connected to the selected word line); and an IO gate connecting a corresponding column to a data input/output terminal DQ via an internal data line in response to the column designating signal applied from column decoder 510. In FIG. 12, the sense amplifier and the IO gate are shown in a block 512.

Boosting circuit 508 generates a signal having a voltage level higher than an operating power supply voltage in response to an activating signal $\phi 0$ applied from a clock control circuit 514. Clock control circuit 514 generates necessary internal control signals in response to an external row address strobe signal /RAS, a column address strobe signal /CAS and a write enable signal /WE. In FIG. 12, clock control circuit 514 is shown supplying the internal control signal to only address buffer 502 and boosting circuit 508.

In operation, address buffer 502 generates internal row and column address signals from multi-bit address signal A0–An. Timings for generating internal row address signal and internal column address signal are given by signals /RAS and /CAS, respectively. Word line driver 506 drives the selected word line in response to the row designating signal from row decoder 504. Accordingly, a potential of selected word line WL rises. In response to the potential rise of word line WL, transfer gate 41 in memory cell MC becomes conductive, capacitor 42 is connected to bit line BL, and a potential of bit line BL changes according to the stored electric charges of capacitor 42. Since no selected memory cell is connected to a complementary bit line /BL, a potential of complementary bit line /BL is at a precharge potential level. The sense amplifier in block 512 then senses and amplifies a potential difference between bit lines BL and /BL.

These bit lines BL and /BL are selected through the IO gate in response to column decoding operation of column decoder 510, so that the data write or read to memory cell MC is carried out. Write enable signal /WE determines which of data write and read is to be carried out.

Boosting circuit 508 generates a boost signal because of the following reason. Transfer gate 41 in memory cell MC is structured by the n-channel MOS transistor. Transfer gate 41 can transmit a voltage of Vcc–Vth level when a potential of word line WL is at an operating power supply voltage Vcc level. Vth represents a threshold voltage of transfer gate 41. Thus, a full Vcc level voltage cannot be stored in capacitor 42. Capacitor 42 can store electric charges Q given by Q=C·(V–Vcp), where C represents capacitance of capacitor 42, V represents a voltage transmitted through transfer gate 41, and Vcp represents a potential of the other electrode (cell plate) of capacitor 42. Voltage V has to be increased in order to increase the stored electric charges Q of capacitor 42. Thus, boosting circuit 508 generates the boost signal for boosting the potential level of word line WL to a level still higher than operating power supply voltage Vcc level in order to eliminate signal transmission loss in transfer gate 41. Accordingly, a high level voltage Vcc applied on bit line BL is written in capacitor 42.

FIG. 13 is a schematic diagram showing a structure of a conventional boosting circuit. In FIG. 13, boosting circuit includes a boost signal generating circuit 30 generating a boost signal $\phi$out from power supply voltage Vcc, and a clamping circuit 60 clamping boost signal $\phi$out supplied to a boost line 50 from boost signal generating circuit 30 to a predetermined potential. Boost signal $\phi$out on boost line 50 is supplied, for example, to a gate of MOS transistor 41 in an internal circuit 40 serving as a memory cell array. In case of the DRAM, boost signal $\phi$out on boost line 50 is transmitted onto the selected word line through the word line driver. In other words, internal circuit 40 is considered to include the word line driver and the memory cell array in the DRAM. Since the boosting circuit in a semiconductor device will be discussed in general in the following, this array portion will be described as the internal circuit.

A voltage level of boost signal $\phi$out on boost line 50 is equal to or greater than the sum of threshold voltage Vth and power supply voltage Vcc of MOS transistor 41.

Boost signal generating circuit 30 includes a boost control circuit 31 operating by using power supply voltage Vcc and the ground potential, respectively supplied to a power supply voltage node 10 and a ground potential node 20, as operating power supply voltages, for generating boost control signals $\phi 1$, $\phi 2$, and $\phi 3$ in response to boost activating signal φ0; and a booster 32 generating boost signal φout on boost line 50 in response to boost control signals φ1 through φ3. Booster 32 includes an n-channel MOS transistor 32a connected between power supply voltage node 10 and boost line 50 and responsive to a first boost control signal φ1 for connecting power supply voltage node 10 and boost line 50 electrically; a capacitor 32b responsive to second boost control signal φ2 for boosting the signal potential on boost line 50 through the capacitive coupling, and an n-channel MOS transistor 32c connected between boost line 50 and ground potential node 20 and responsive to third boost control signal φ3 for connecting boost line 50 and ground potential node 20 electrically.

Clamping circuit 60 includes two diode-connected n-channel MOS transistors 61 and 62. Diode-connected n-channel MOS transistors 61 and 62 are serially connected between boost line 50 and power supply voltage node 10 in a forward direction from boost line 50. The operation of the structure shown in FIG. 13 will be described below referring to FIG. 14.

Before time t1, boost activating signal φ0 is at the low level ("L"). In this state, boost control signals φ1, φ2 and φ3 generated from boost control circuit 31 are at the low level, the low level, and the high level ("H"), respectively. In booster 32, MOS transistor 32a is turned off, MOS transistor 32c is turned on, and boost line 50 is at the low level. In clamping circuit 60, both MOS transistors 61 and 62 are turned off because they are in the reverse-biased state.

At time t1, when boost activating signal φ0 rises to the high level, boost control circuit 31 first renders the third boost control signal to the low level, and raises the first boost control signal φ1 to the high level for a predetermined period. Consequently, MOS transistor 32a is turned on and MOS transistor 32c is turned off, and boost line 50 is charged to the level of (Vcc-Vth) via MOS transistor 32a. Vth indicates the threshold voltage of transistor 32a. In the following description, the threshold voltage of MOS transistors 32a, 32c, 61, and 62 are all assumed to be Vth, unless otherwise mentioned.

At time t2, first boost control signal φ1 falls to the low level, and MOS transistor 32a is turned off. Boost line 50 is in an electrically floating state at the voltage level of (Vcc-Vth). At this time, the second boost control signal φ2 rises to the high level and the voltage level of boost line 50 increases by capacitor 32b. When boost signal φout on boost line 50 is higher than the voltage level of (Vcc+2Vth), MOS transistors 62 and 61 are turned on, causing boost line 50 electrically connected to power supply voltage node 10. More particularly, voltage φout of boost line 50 is clamped at the voltage level of (Vcc+2Vth) as shown in FIG. 14 at (e).

In response to the boost signal of boost line 50, transistor 41 becomes conductive for transmitting the signal at power supply voltage Vcc level without signal loss into internal circuit 40.

At time t3, when boost activating signal φ0 falls to the low level, second boost control signal φ2 falls to the low level and third boost control signal φ3 rises to the high level. Consequently, MOS transistor 32c is turned on and boost line 50 is discharged to ground potential node 20 via MOS transistor 32c, causing boost signal φout to be at the low level (threshold voltage Vth level).

Clamping circuit 60 prevents the generation of the boost signal having an unduly high voltage level.

In a semiconductor integrated circuit device such as a semiconductor memory device, a transistor serving as a component is made smaller for higher density and higher integration and a breakdown voltage of the transistor is decreased. In order to keep the reliability of elements, the power supply voltage is required to be reduced. However, the semiconductor memory devices is not used singly, but serves as a component of a system. A logic IC, such as a processor, has not been processed so much finely as the semiconductor memory device. The system power supply voltage is determined by the power supply voltage of the IC, such as TTL. In order to construct a single power supply system, in the semiconductor memory device, an external power supply voltage is down-converted internally so as to generate a down-converted operating power supply voltage for driving internal circuitry. For example, using an external power supply voltage extVcc of 5V, 3.3V of internal power supply voltage intVcc is generated by a voltage-down converter provided internally. An example of a semiconductor device having such a dual power supply voltage is disclosed in "Dual Operating Voltage Scheme—Single 5V 16M bit DRAM" written by Horiguchi et al., IEEE, *Journal of Solid-State Circuits*, Vol. 23, No. 5, October, 1988.

Threshold voltage Vth of the MOS transistor can be obtained by flat band voltage VFB, Fermi level φF, a capacitance Cox per unit area of a gate insulating film and a charge amount induced at a channel surface as follows:

$$Vth = VFB + 2 \cdot \phi F - (QD/Cox)$$

More particularly, since the scaling rule cannot apply to threshold voltage Vth, the threshold voltage is not scaled down in response to the fine processing of the transistor, unlike the power supply voltage. Also, since a back gate voltage (a substrate bias voltage) is applied to the MOS transistor, an absolute value of the threshold voltage is increased. As to threshold voltage Vth of this n-channel MOS transistor, for example, that of a transistor of a 0.5 μm design rule is 1.7V.

When the boosting circuit shown in FIG. 13 is employed for boosting a word line in a 16M-bit DRAM by utilizing transistors of a 0.5μm design rule, the internal power supply voltage (internal down-converted voltage) intVcc is used as power supply voltage Vcc. Burn-in test is one of the reliability determination tests of the DRAM. In the burn-in test, initial failure due to particles are removed by applying a power supply voltage higher than the power supply voltage usually used. Screening of initial failure is carried out. When 6V is applied as internal power supply voltage intVcc in burn-in test of the DRAM, boosting voltage φout of boost line 50 during boosting is expressed as follows:

$$Vcc + 2 \cdot Vth = 6 + 2 \cdot 1.7 = 9.4V$$

Since -3V is applied as substrate bias voltage Vpp, 9.4-(-3)= 12.4V is applied, for example, across a PN junction (a junction between a substrate and a source/drain region) of n-channel MOS transistor 32c in booster 32. Since the junction breakdown voltage of the transistor is 12V, reliability of the transistor is impaired. In order to avoid such a problem, possible consideration is to reduce power supply voltage Vcc during the burn-in test. However, when power supply voltage Vcc during the burn-in test is reduced, time taken for the burn-in test will be longer. Especially in a semiconductor integrating circuit device including an internal power supply voltage-down converter within the chip, the period of the burn-in test is necessarily long because internal power supply voltage intVcc lower than external power supply voltage extVcc is used as power supply voltage Vcc. If power supply voltage Vcc during the burn-in test is further reduced, time taken for burn-in test will be still longer.

Such problem regarding boosting voltage can be found not only in the burn-in test, but also in the acceleration test such as life test.

SUMMARY OF THE INVENTION

An object of the present invention is to provide a semiconductor device including a boosting circuit which does not impair the reliability of components.

Another object of the present invention is to provide a semiconductor device which does not impair the reliability of components and the device even in an overvoltage generating mode of operation such as burn-in test.

In a semiconductor device according to the present invention, a clamping level of a boosting signal in a clamping circuit at the time of generation of an overvoltage, such as burn-in test, is changed from that in a normal operating mode.

Preferably, the clamping level of boosting signal for the power supply voltage in the normal operating mode is made higher than that in the overvoltage generating mode such as burn-in test.

The clamping level of the clamping circuit changes in response to the voltage level of the power supply voltage. If the difference between the power supply voltage and the voltage level of the boosting signal is reduced in the overvoltage generating mode, the boosting voltage level can be decreased without decreasing the power supply voltage level. Consequently, deterioration of components in the overvoltage generating mode, such as burn-in test, can be prevented. The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
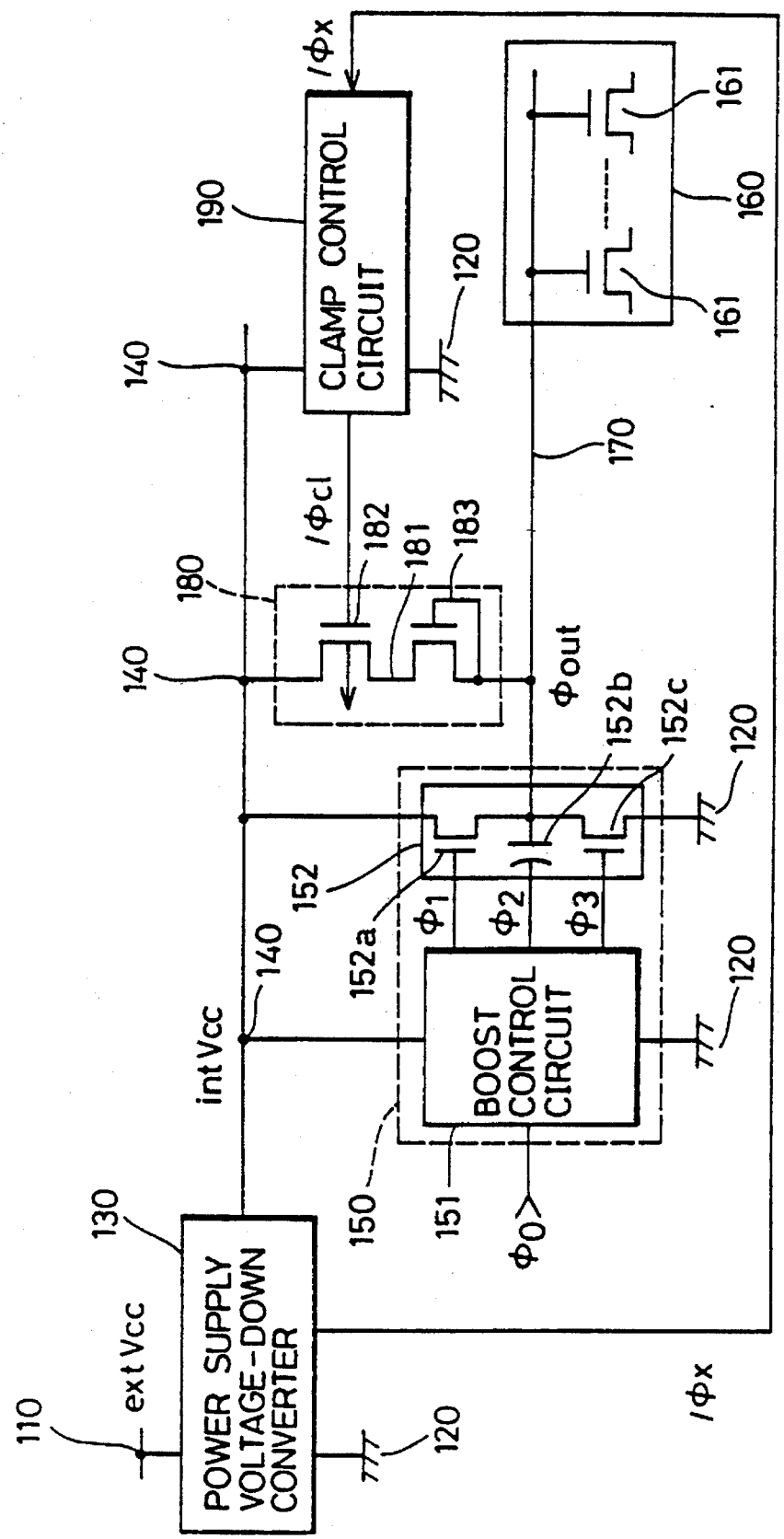
FIG. 1 shows a structure of a main portion of a semiconductor device according to one embodiment of the present invention.

FIG. 1 shows a structure of a main portion of a semiconductor device according to one embodiment of the present invention. In FIG. 1, a semiconductor device includes a power supply voltage-down converter 130 operating by using an external power supply voltage extVcc supplied to an external power supply voltage node 110 and a ground voltage supplied to an ground potential node 120 as operating power supply voltages, and down-converting external power supply voltage extVcc supplied to external power supply node 110 for outputting an internal power supply voltage intVcc to an internal power supply node 140; and a boost signal generating circuit 150 operating by using internal power supply voltage intVcc supplied to internal power supply node 140 and the ground voltage supplied to ground potential node 120 as operating power supply voltages, and responsive to a boost activating signal φ0 for outputting a boost signal φout to a boost line 170.

Boost signal φout on boost line 170 is supplied, for example, to a gate of an n-channel MOS transistor 161 such as memory cell transfer gate in an internal circuit 160 such as a memory cell array. Boost line 170 corresponds to a word line in a semiconductor memory device as described in referring to FIG. 13 (as described above, a word line driver portion in the semiconductor memory device is not shown).

Power supply voltage-down converter 130 includes a means for detecting whether or not external power supply extVcc supplied to external power supply node 110 is at a predetermined voltage level and driving a burn-in set signal /φx to the low level active state when external power supply voltage extVcc is higher than the predetermined voltage level (this structure will be described in detail later).

Figure 13:
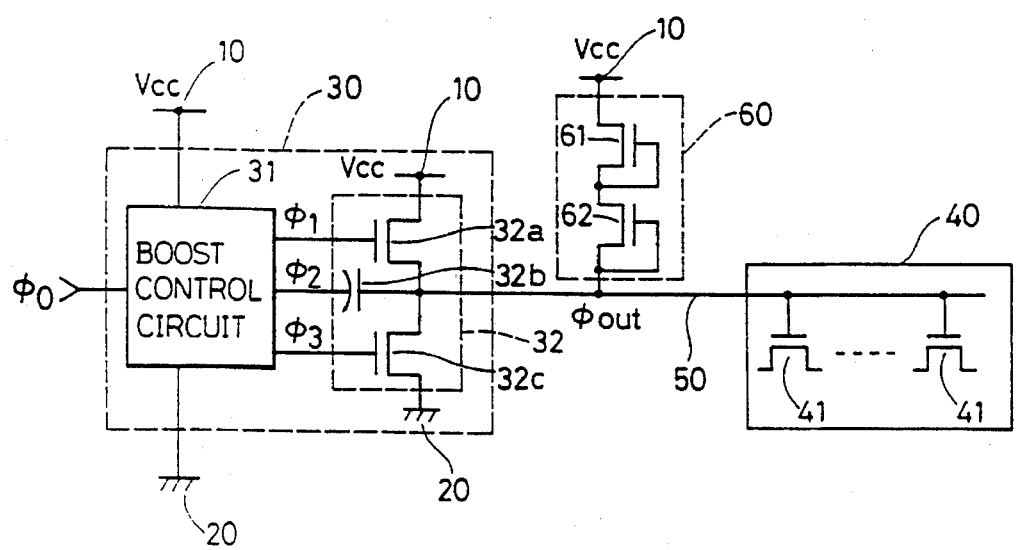
FIG. 13 shows a structure a conventional boosting circuit.
Figure 14:
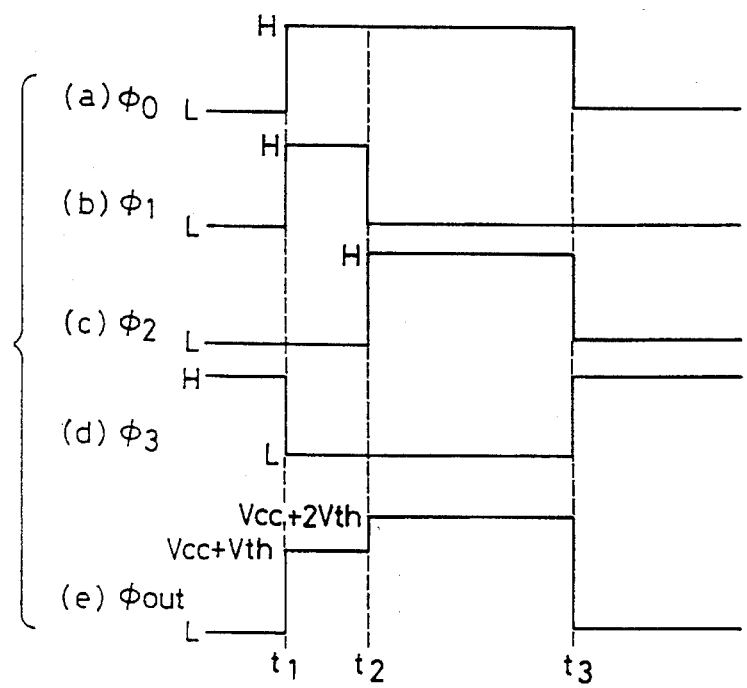
FIG. 14 is a signal waveform showing a boosting operation of the conventional boosting circuit.

Similar to the structure shown in FIG. 13, boost signal generating circuit 150 includes a boost control circuit 151 responsive to boost activating signal φ0 for generating control signals φ1, φ2 and φ3; and a booster 152 generating boost signal φout on boost line 170 in response to control signals φ1–φ3 supplied from boost control circuit 151. Booster 152 includes an n-channel MOS transistor 152a responsive to control signal φ1 for electrically connecting boost line 170 to internal power supply node 140; an n-channel MOS transistor 152c responsive to control signal φ3 for electrically connecting boost line 170 to ground potential node 120; and a capacitor 152b responsive to control signal φ2 for boosting a signal potential on boost line 170 through the capacitive coupling. An operation of boost signal generating circuit 150 is similar to the conventional boost signal generating circuit shown in FIG. 13. Boost control circuit 151 operates by using internal power supply voltage intVcc supplied to internal power supply node 140 and a ground voltage supplied to ground potential node 120 as operating power supply voltages. Thus, the high level of control signals φ1, φ2 and φ3 generated from boost control circuit 151 will be the level of internal power supply voltage intVcc.

The semiconductor device further includes a clamp control circuit 190 operating by using internal power supply voltage intVcc on internal power supply node 140 and the ground voltage on ground potential node 120 as operating power supply voltage, and responsive to burn-in set signal /φx for generating a clamping level control signal /φcl; and a clamping circuit 180 provided between internal power supply node 140 and boost line 170 for clamping a voltage level of boost signal φout on boost line 170.

Clamping circuit 180 includes a diode-connected n-channel MOS transistor 183 provided between boost line 170 and an internal node 181, and a p-channel MOS transistor 182 provided between internal node 181 and internal power supply node 140 for receiving clamping level control signal /φcl from clamp control circuit 190 at its gate. n-channel MOS transistor 183 and p-channel MOS transistor 182 have threshold voltages VthN and VthP, respectively. Clamp control circuit 190 sets a clamping level control signal /φcl to the low level, or an active state, if burn-in set signal /φx is in the active state. Operation of the semiconductor device shown in FIG. 1 will be described below referring to FIGS. 2 and 3.

Figure 2:
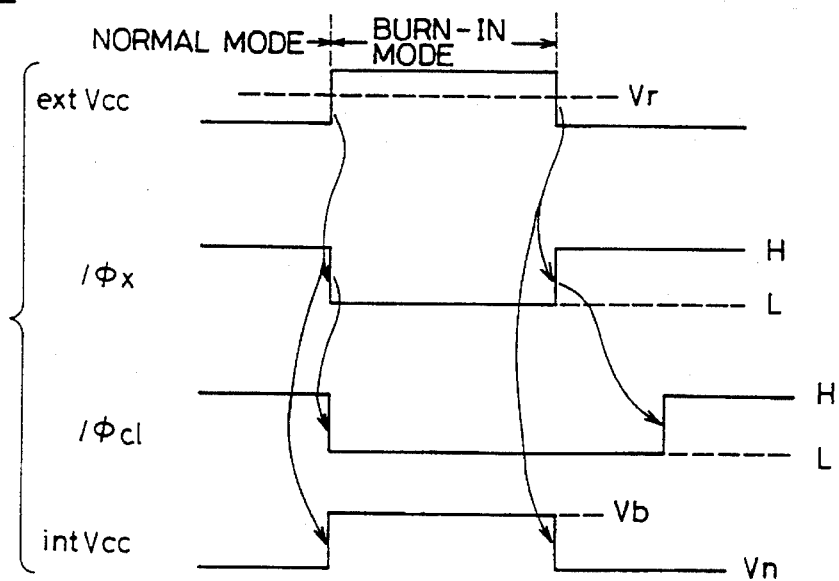
FIG. 2 is a signal waveform schematically showing an operation of the circuitry shown in FIG. 1.

First, referring to FIGS. 1 and 2, operations of the power supply voltage-down converter and the clamp control circuit will be briefly described. When the semiconductor device is in the normal operating mode, external power supply voltage extVcc supplied to external power supply node 110 is equal to or lower than a predetermined voltage level Vr, and power supply voltage-down converter 130 generates and supplies internal power supply voltage intVcc of a constant voltage level Vn from external power supply voltage extVcc. In this state, power supply voltage-down converter 130 keeps burn-in set signal /φx at the high level or an inactive state, while clamp control circuit 190 keeps clamping level set signal /φcl also at the high level in response to the high level burn-in set signal /φx.

In the overvoltage generating mode such as burn-in mode, external power supply voltage extVcc is set to any voltage level equal to or higher than a predetermined voltage level Vt. In this overvoltage generating mode (simply referred to as burn-in mode hereinafter), internal power supply voltage intVcc generated from power supply voltage-down converter 130 also increases according to the increase of external power supply voltage extVcc (in FIG. 2, the voltage level of internal power supply voltage intVcc in the burn-in mode is indicated by Vb). According to the increase of external power supply voltage extVcc, burn-in set signal /φx generated from power supply voltage-down converter 130 falls to the low level, and clamp control circuit 190 renders clamping level control signal /φcl to fall in response to the low level burn-in set signal /φx.

Upon completion of burn-in mode, when external power supply voltage extVcc becomes lower than predetermined voltage level Vr, burn-in set signal /φx generated from power supply voltage-down converter 130 returns to the high level, and clamping level control signal /φcl generated from clamp control circuit 190 also rises to the high level after a predetermined time period.

In clamp control circuit 190, clamping level control signal /φcl is delayed by a predetermined time period before rising to the high level at the time of returning from this burn-in mode to the normal mode. This is to prevent the change of the clamping level on boost line 170 due to toggling of clamping level control signal /φcl depending on an unstable level of the internal power supply voltage.

Figure 3:
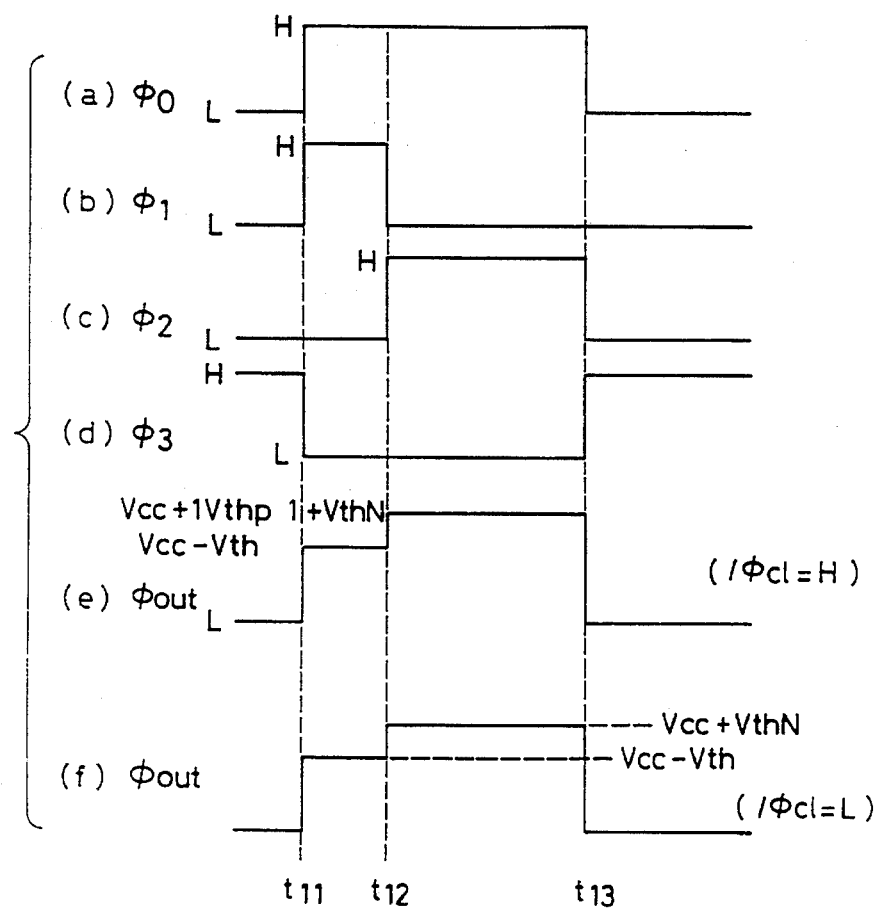
FIG. 3 is a signal waveform showing operations of a boost signal generating circuit and a clamping circuit shown in FIG. 1.

Next, referring to FIGS. 1 and 3, an operation of clamping circuit 180 will be described.

In the normal mode, burn-in set signal /φx is at the high level, while clamping level control signal /φcl generated from clamp control circuit 190 is at the high level or the level of internal power supply voltage intVcc.

If boost activating signal φ0 rises to the high level at time t11, boost control circuit 151 first sets boost control signal φ3 to the low level and raises boost control signal φ1 to the high level for a predetermined period. Accordingly, boost line 170 is charged via an n-channel MOS transistor 152a, and the voltage level of boost line 170 attains Vcc (intVcc)–Vth level.

Next, if boost control signal φ1 falls to the low level, boost line 170 is in the floating state at the (intVcc-Vth) level.

At the time t12, if boost control signal φ2 rises to the high level, the voltage level of boost line 170 increases through the capacitive coupling of a capacitor 112b. MOS transistor 183 in clamping circuit 180 is diode-connected and drop the voltage only by its threshold voltage VthN. p-channel MOS transistor 182 receives control signal /φcl, which is at the high level or internal power supply voltage intVcc, at its gate. Consequently, p-channel MOS transistor 182 becomes conductive when the voltage level of internal node 181 is at least (intVcc+|VthP|). More particularly, clamping circuit 180 becomes conductive when the voltage level on boost line 170 is at least (intVcc+|VthP|+VthN), to electrically connect boost line 170 with internal power supply node 140. Accordingly, boost signal φout on boost line 170 is clamped at (intVcc+|VthP|+VthN).

At time t13, when boost activating signal φ0 attains the low level, boost control signal φ2 attains the low level and boost control signal φ3 attains the high level, causing boost line 170 to be discharged to ground potential node 120 through n-channel MOS transistor 152.

In the burn-in mode, burn-in set signal /φx attains the low level, while clamping level control signal /φcl attains the low level. In this state, p-channel MOS transistor 182 is normally turned on to connect internal node 181 with internal power supply node 140 electrically in clamping circuit 180. Therefore, when boost signal generating circuit 150 is activated for generating boost signal φout in response to boost activating signal φ0, boost signal φout on boost line 170 is clamped only by n-channel MOS transistor 183 because the voltage level of internal node 181 is at internal power supply voltage intVcc level. In other words, the voltage level of boost signal φout on boost line 170 is intVcc+VthN.

Operation of boost signal generating circuit 150 is the same in the normal mode and in the burn-in mode. Thus, the clamping level on boost line 170 in the normal mode is different from that in the burn-in mode. For example, if the conventional clamping circuit shown in FIG. 13 is employed, when 6V is applied as internal power supply voltage intVcc, boost signal φout on a boost line 50 is clamped at 9.4V. In this embodiment, however, even if the same 6V internal power supply voltage intVcc is applied, the boost level can be reduced as follows:

$$intVcc+VthN=6+1.7=7.7V$$

Since −3V is applied as substrate bias voltage Vbb, the voltage of 10.7V is applied to the PN junction of n-channel MOS transistor 152c in booster 152 when the boost signal is generated. However, this 10.7V voltage does not exceed the junction breakdown voltage of a transistor, or 12V, so that its reliability is not at all impaired. A specific structure of each portion will be described below.

Figure 4:
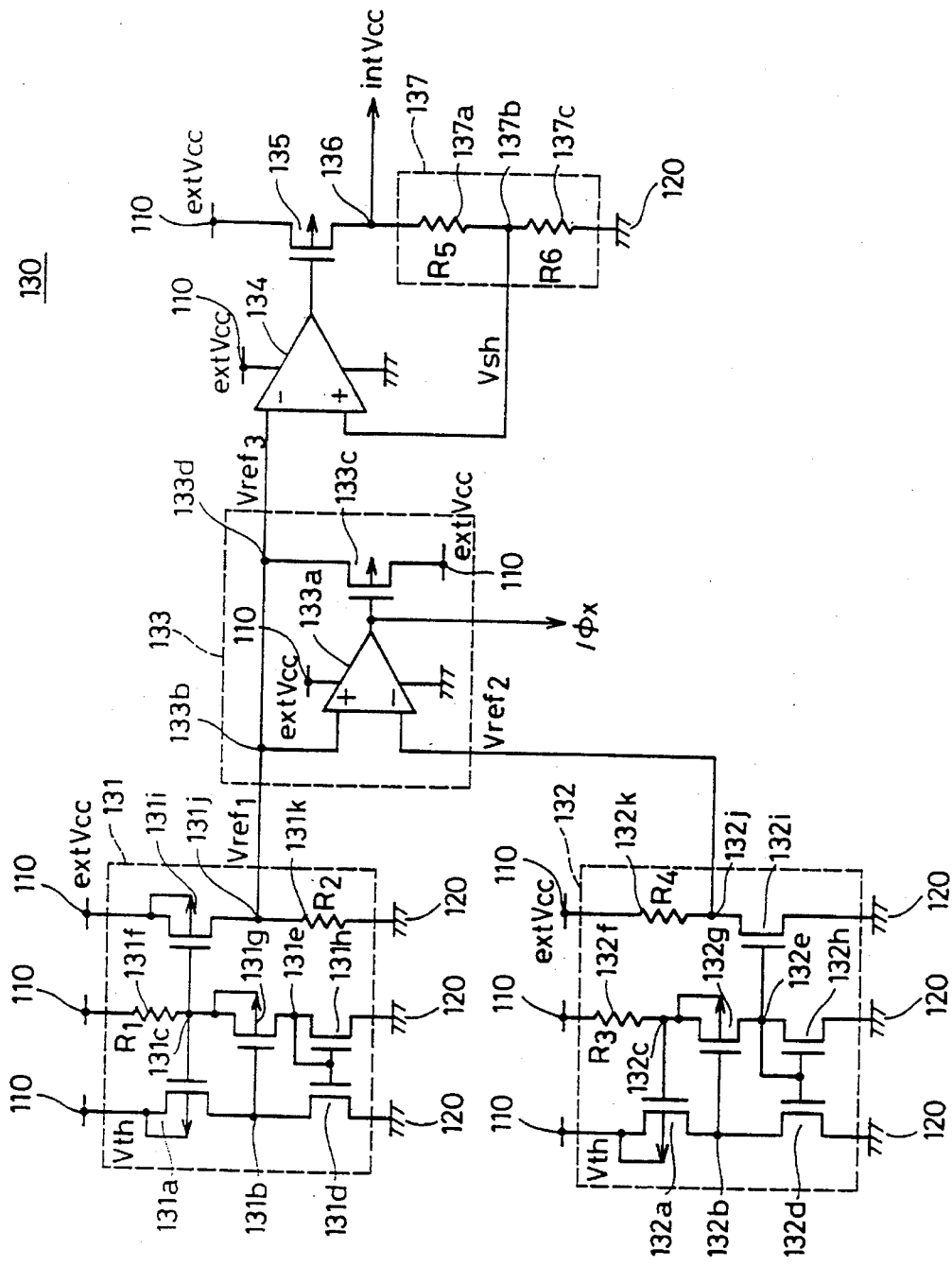
FIG. 4 shows a structure of a power supply voltage-down converter shown in FIG. 1.

FIG. 4 is a specific structure of the power supply voltage-down converter shown in FIG. 1. In FIG. 4, power supply voltage-down converter 130 includes a first reference voltage generating circuit 131 operating by using external power supply voltage extVcc supplied to external power supply node 110 and the ground voltage supplied to ground potential node 120 as operating voltages for generating a first reference voltage Vref1 from external power supply voltage extVcc; a second reference voltage generating circuit 132 operating by using external power supply voltage extVcc and the ground potential as operating voltages for generating a second reference voltage Vref2 from external power supply voltage extVcc; a reference voltage combining circuit 133 generating burn-in set signal /φx according to the magnitude of the first and the second reference voltages Vref1 and Vref2, and combining these reference voltages Vref1 and Vref2 for generating a third reference voltage Vref3; a level shifting circuit 137 which level-shifts internal power supply voltage intVcc appeared at an internal node 136 for outputting a level shift voltage Vsh; a comparing circuit 134 comparing level shift voltage Vsh from level shifting circuit 137 with the third reference voltage Vref3; and a p-channel MOS transistor 135 provided between external power supply node 110 and internal node 136 and responsive to an output of comparing circuit 134 for selectively conducting.

First reference voltage generating circuit 131 includes a p-channel MOS transistor 131a connected between external power supply voltage node 110 and an internal node 131b; an n-channel MOS transistor 131d connected between internal node 131 and ground potential node 120 and having its gate connected to an internal node 131e; a resistance 131f having a resistance value R1 and connected between external power supply voltage node 110 and an internal node 131c; a p-channel MOS transistor 131g connected between internal node 131h and internal node 131e and having its gate connected to internal node 131b; and an n-channel MOS transistor 131a connected between internal node 131e and ground potential node 120.

MOS transistor 131h has its gate connected to internal node 131e and a gate of MOS transistor 131d. MOS transistors 131d and 131h construct a current mirror circuit. An absolute value of the threshold voltage of p-channel MOS transistor 131a is Vth.

First reference voltage generating circuit 131 further includes a p-channel MOS transistor 131i connected between external power supply voltage node 110 and internal output node 131d and having its gate connected to node 131c; and a second resistance 131k having a resistance value R2 and connected between internal output node 131i and ground potential node 120. First reference voltage Vref1 is output from internal output node 131j.

Second reference voltage generating circuit 132 includes a p-channel MOS transistor 132a connected between external power supply voltage node 110 and an internal node 132b and having its gate connected to an internal node 132c; an n-channel MOS transistor 132d connected between an internal node 132b and ground potential node 120 and having its gate connected to an internal node 132e; a third resistance 132f having a resistance value R3 and connected between external power supply voltage node 110 and internal node 132c; a p-channel MOS transistor 132g connected between internal node 132c and internal node 132e and having its gate connected to internal node 132b; an n-channel MOS transistor 132h connected between internal node 132e and ground potential 120, and having its gate connected to internal node 132e and a gate of MOS transistor 132d; a fourth resistance 132k having a resistance value R4 and connected between external power supply voltage node 110 and an internal output node 132j; and an n-channel MOS transistor 132i connected between internal output node 132j and ground potential node 120 and having its gate connected to internal node 132e.

An absolute value of the threshold voltage of p-channel MOS transistor 132a is Vth. MOS transistors 132h and 132d constitute a current mirror circuit, and also MOS transistors 132h and 132i constitute another current mirror circuit.

Reference voltage combining circuit 133 includes a current mirror-type differential amplifying circuit 133a receiving at its positive input first reference voltage Vref1 supplied on internal node 133b from first reference voltage generating circuit 131, and receiving at its negative input second reference voltage Vref2 output from second reference voltage generating circuit 132; and a p-channel MOS transistor 133c connected between an internal node 133d and external power supply voltage node 110 for receiving an output of differential amplifying circuit 133a at its gate.

Differential amplifying circuit 133a operates using external power supply voltage extVcc supplied to external power supply voltage node 110 and the ground voltage as operating power supply voltages. Differential amplifying circuit 133a generates burn-in set signal /φx. If first reference voltage Vref1 supplied at the positive input is higher than second reference voltage Vref2 supplied at the negative input, differential amplifying circuit 133a generates the high level burn-in set signal. The low level burn-in set signal /φx is otherwise generated.

Comparing circuit 134 is structured by the current mirror-type differential amplifying circuit which receives third referential voltage Vref3 supplied to internal node 133d at its negative input and receives shift voltage Vsh from level shifting circuit 137 at its positive input. Differential amplifying circuit 134 operates using external power supply voltage extVcc and the ground voltage as operating power supply voltages.

Level shifting circuit 137 includes resistances 137a and 137c serially connected between internal output node 136 and ground potential node 120. Resistances 137a and 137c respectively have resistance values R5 and R6 and generate level shift voltage Vsh by resistively dividing internal power supply voltage intVcc. More particularly, level shift voltage Vsh can be obtained by the below expression:

$Vsh = intV_{cc} \cdot R6/(R5+R6)$

Operation of each circuit will be described in turn.

Figure 5:
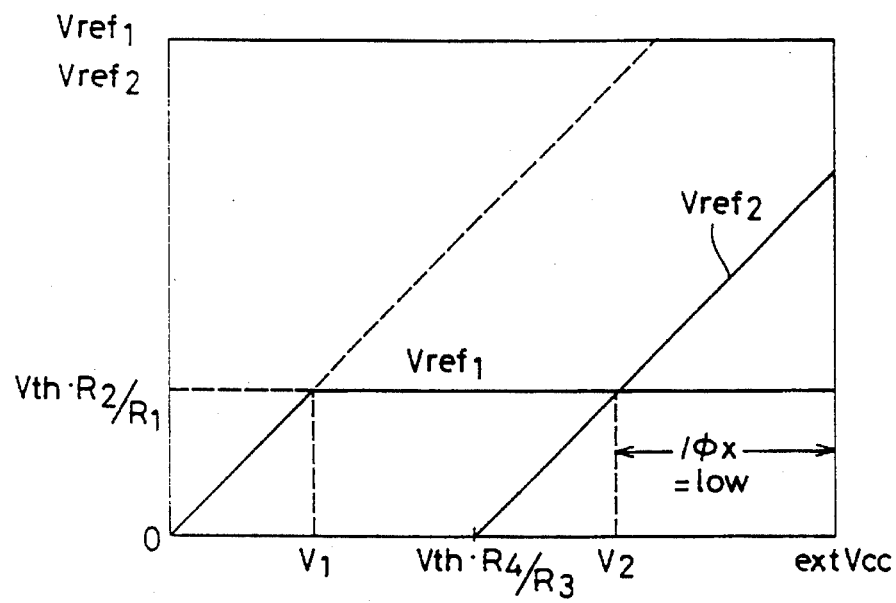
FIGS. 5 and 6 illustrates an operation of the power supply voltage-down converter shown in FIG. 4.

First, referring to FIG. 5, operation of first and second reference voltage generating circuits shown in FIG. 4 will be described. In FIG. 5, abscissa indicates external power supply voltage extVcc and ordinate indicates first and second reference voltages Vref1 and Vref2.

In first reference voltage generating circuit 131, if external power supply voltage extVcc increases, current I flows through resistance R1 and the potential at node 131c of (extVcc−I·R1) increases according to the rise of external power supply voltage extVcc. If extVcc−I·R1<Vth, MOS transistors 131a and 131i are turned on and current I1 flows therethrough (assume that the threshold voltages of MOS transistors 131a and 131i are the same). As current I1 flows through resistance 131a, first reference voltage Vref1 (=I1·R2) increases in response to the increase of external power supply voltage extVcc.

The current flowing through resistance R1 increases in response to the increase of external power supply voltage extVcc and current I1 flowing through resistance 131k also increases, and therefore first reference voltage Vref1 increases in response to the increase of external power supply voltage extVcc.

Node 131b is charged by MOS transistor 131a, to have its potential increased. Since the potential of node 131c is lower than neither the potential of node 131b nor the threshold voltage of MOS transistor 131g (voltage is decreased by the threshold voltage of MOS transistor 131a), MOS transistor 131a is turned on so that node 131e is charged through MOS transistor 131g. If external power supply voltage extVcc attains a predetermined voltage V1 and the potential of node 131e attains at least the threshold voltage of MOS transistor 131h, MOS transistors 131h and 131d are turned on.

Since MOS transistors 131d and 131h constitute a current mirror circuit, the same amount of current flows through both transistors (assume that MOS transistors 131d and 131a are the same in size). The current flowing through MOS transistor 131h is supplied through transistor 131g and resistance 131f, while the current is supplied to MOS transistor 131d through MOS transistor 131a. If the amount of current flowing through MOS transistor 131a is greater than that of the current flowing through MOS transistor 131g, the potential at node 131b increases, the current flowing through MOS transistor 131g decreases, the potential at node 131c increases, and the conductance of MOS transistor 131a decreases to reduce its supply current value.

On the other hand, if the current value flowing through MOS transistor 131a is smaller than the current value flowing through MOS transistor 131g, the potential at node 131d decreases, the conductance of MOS transistor 131g increases, the potential at node 131c decreases, and accordingly the current supply amount of MOS transistor 131a increases. The equal amount of current is given to resistance 131f and MOS transistor 131a due to the feedback operation of MOS transistor 131g. By making resistance value R1 of resistance 131f sufficiently large, and making W/L (gate width/gate length) of MOS transistor 131a sufficiently larger than other MOS transistors, the potential at node 131c becomes lower than external power supply voltage extVcc approximately by absolute value Vth of the threshold voltage of MOS transistor 131a. In other words, the voltage drop across resistance 131f will be equal to absolute value Vth of the threshold voltage of MOS transistor 131a. In this case, current I flowing through resistance 131f is I=Vth/R1. The current flowing through resistance 131f is equal to the current flowing through MOS transistor 131i and resistance 131g. Consequently, first reference voltage Vref1 will be a constant value given by the following expression:

$$Vref1 = Vth \cdot R2/R1$$

In second reference voltage generating circuit 132, MOS transistors 132a, 132d, 132g and 132h as well as resistance 132f constitute a constant current circuit as in first reference voltage generating circuit 131. Node 132e is connected to a gate of MOS transistor 132i, so that a constant current I also flows through MOS transistor 132i. Second reference voltage Vref2 output from node 132g can be given by the following expression:

$$Vref2 = extVcc - I2 \cdot R4$$

Current I2 flows through resistance 132k. Current I2 is substantially equal to the current flowing through resistance 132f. The current flowing through resistance 132f can be given by Vth/R3 as in first reference voltage generating circuit 131. Thus, second reference voltage Vref2 can be given by the following expression:

$$Vref2 = extVcc - (Vth \cdot R4/R3)$$

More particularly, if external power supply voltage extVcc is not less than Vth·R4/R3, second reference voltage Vref2 will increase in response to external power supply voltage extVcc. When external power supply voltage extVcc attains a certain voltage level V2, second reference voltage Vref2 is higher than first reference voltage Vref1.

Figure 6:
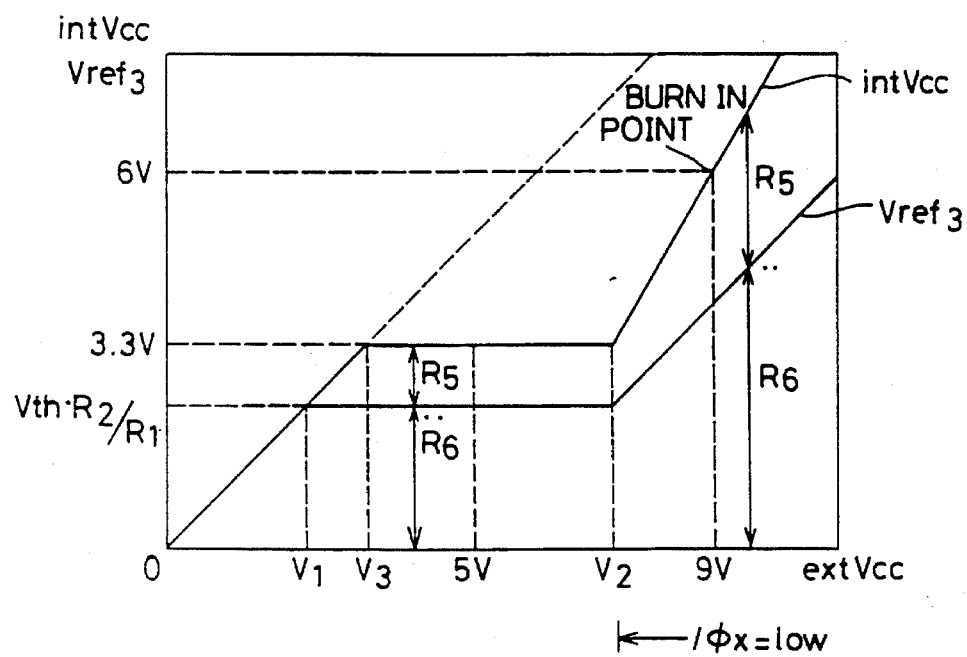

Referring to FIG. 6, operation of reference voltage combining circuit shown in FIG. 4 will be described. In FIG. 6, abscissa indicates external power supply voltage extVcc and ordinate indicates internal power supply voltage intVcc and third reference voltage Vref3.

In reference voltage combining circuit 133, differential amplifying circuit 133a receives first reference voltage Vref1 at its positive input and second reference voltage Vref2 at its negative input. If first reference voltage Vref1 is higher than second reference voltage Vref2, differential amplifying circuit 133a generates the high level burn-in set signal /φx. In this case, p-channel MOS transistor 133c is turned off. Consequently, third reference voltage Vref3 appearing at node 133d is equal to first reference voltage Vref1 supplied to node 133b.

If external power supply voltage extVcc is higher than predetermined voltage V2, burn-in set signal /φx output from differential amplifying circuit 133a falls to the low level. Accordingly, p-channel MOS transistor 133c is turned on so that external power supply voltage extVcc supplied to power supply voltage node 110 is transmitted to node 133d. Third reference voltage Vref3 at node 133d increases in response to external power supply voltage extVcc. Third reference voltage Vref3 on node 133d is also supplied to a positive input of differential amplifying circuit 133a via node 133b. Thus, if third reference voltage Vref3 is higher than second reference voltage Vref2, an output of differential amplifying circuit 133a attains the high level causing p-channel MOS transistor 133c to be turned off.

Consequently, third reference voltage Vref3 is equal to second reference voltage Vref2 in a region of extVcc>V2 by differential amplifying circuit 133a. p-channel MOS transistor 133c is a variable resistance element in which the conductance changes in response to the output level of differential amplifying circuit 133a, and functions to transmit the current from external power supply voltage node 110 to internal node 133d in response to the potential level of its gate and to increase third reference voltage Vref3 to be equal to second reference voltage Vref2.

Generation of internal voltage intVcc will be described below. Differential amplifying circuit 134 receives third reference voltage Vref3 at its negative input and level shift voltage Vsh from level shifting circuit 137 at its positive input. An output of differential amplifying circuit 134 remains low or at the ground potential level until external power supply voltage extVcc attains a voltage level V3 where Vref3=Vsh. Accordingly, p-channel MOS transistor 135 receiving the output of differential amplifying circuit 134 at its gate is turned on, so that internal power supply voltage intVcc output from node 136 is approximately at the same voltage level as external power supply voltage extVcc.

If level shift voltage Vsh is higher than third reference voltage Vref3, that is, external power supply voltage extVcc is higher than voltage V3, an output of differential amplifying circuit 134 attains the high level causing p-channel MOS transistor 135 to be turned off (or its conductance to decrease). By this feedback operation, level shifting voltage Vsh becomes equal to third reference voltage Vref3. Thus, internal power supply voltage intVcc in this region can be given by the following expression:

$$intVcc = Vref3 \cdot (R5+R6)/R6$$

This expression can be transformed as follows:

$$(intVcc - Vref3) = R5 \cdot Vref3/R6$$

$(intVcc-Vref3) : Vref3 = R5 : R6$

In a voltage region utilized for applying a high power supply voltage during the burn-in test, external power supply voltage extVcc is higher than voltage V2, and burn-in set signal /ϕx is at the low level. In FIG. 6, the burn-in point where the burn-in test is conducted is set at the point of extVcc=9V and intVcc=6V.

Figure 7:
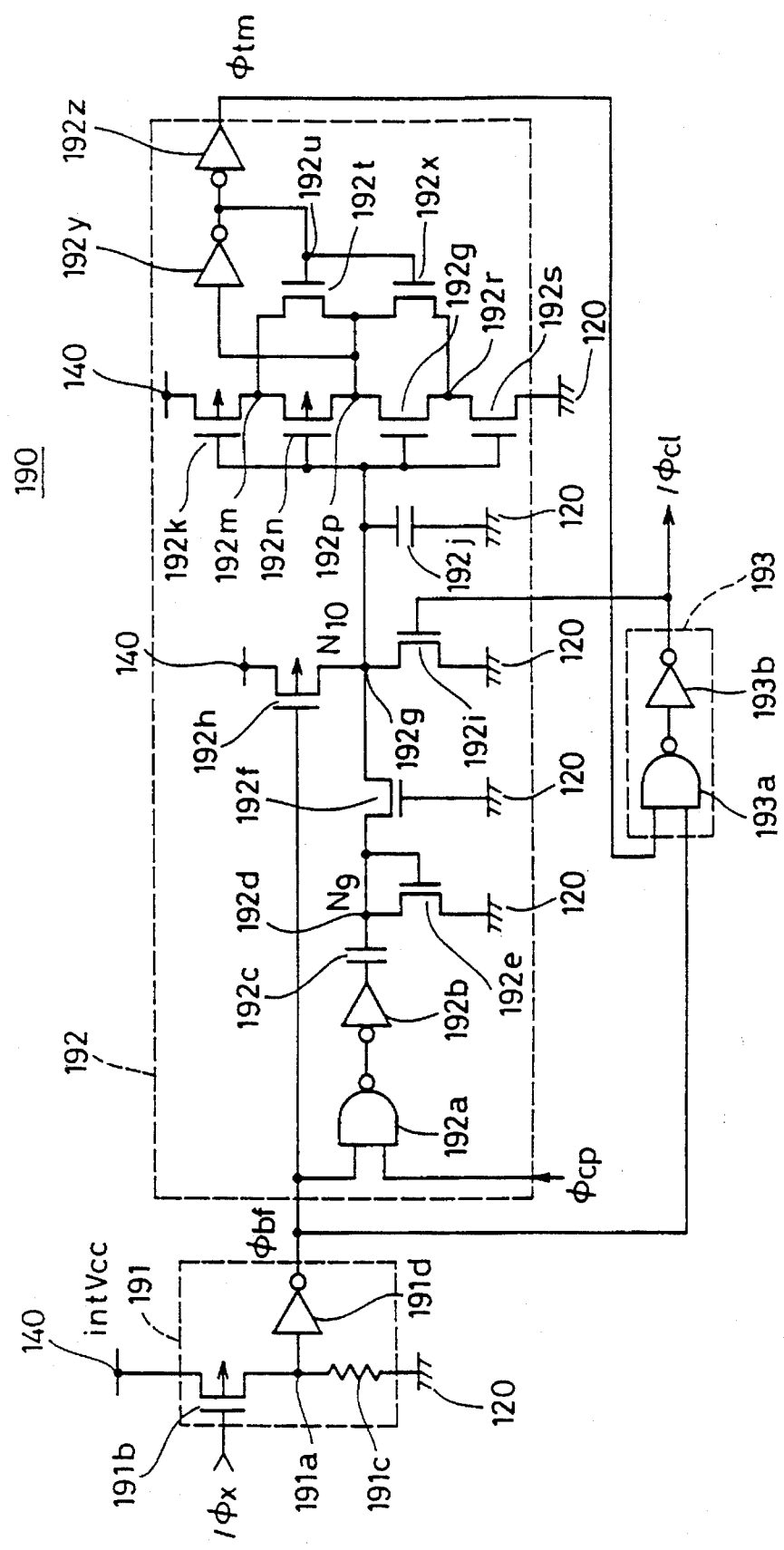
FIG. 7 shows a structure of a clamp control circuit shown in FIG. 1.

Next, referring to FIG. 7, a structure and operation of the clamp control circuit shown in FIG. 1 will be described. In FIG. 7, clamp control circuit 190 includes a buffer circuit 191 operating by using internal power supply voltage intVcc supplied to internal power supply voltage node 140 and the ground voltage supplied to ground potential node 120 as operating power supply voltages for level-converting burn-in set signal /ϕx of external power supply voltage level to a buffer signal ϕbf of the internal power supply voltage level; a timer circuit 192 delaying an active-to-inactive transition of buffer signal ϕbf from buffer circuit 191; and a control signal generating circuit 193 outputting clamping level control signal /ϕcl in response to a timer signal ϕtm from timer circuit 192 and buffer signal ϕtm from buffer circuit 191.

Buffer circuit 191 includes a p-channel MOS transistor 191b connected between internal power supply voltage node 140 and an internal node 191a for receiving burn-in set signal /ϕx at its gate; a resistance 191c connected between internal node 191a and ground potential node 120; and an inverter circuit 191d inverting the signal potential on internal node 191a for outputting buffer signal ϕbf. Inverter circuit 191d operates by using internal power supply voltages intVcc as one operating power supply voltage. Consequently, the high level of buffer signal ϕbf is equal to internal power supply voltage intVcc level.

Timer circuit 192 includes an NAND circuit 192a receiving buffer signal ϕbf and a clock signal ϕcp; an inverter circuit 192b inverting an output of NAND circuit 192a; a capacitor 192c transmitting an output of inverter circuit 192b to an internal node 192d through the capacitive coupling; and an n-channel MOS transistor 192e for clamping the voltage N9 of internal node 192d.

Clock signal ϕcp is generated repeatedly at a predetermined period and, in the DRAM, is equivalent to a clock signal for driving a charge pump circuit generating substrate bias voltage VBB. n-channel MOS transistor 192 has its gate and one electrode (drain) connected to internal node 192d and has its other conduction terminal (source) connected to ground potential node 120 for serving as a diode.

Timer circuit 192 further includes an n-channel MOS transistor 192f connected between an internal node 192d and an internal node 192g for receiving the ground voltage at its gate; an n-channel MOS transistor 192i connected between internal node 192g and ground voltage node 120 for receiving clamping level control signal /ϕcl at its gate; a p-channel MOS transistor 192h connected between internal power supply voltage node 140 and internal node 192g for receiving buffer signal ϕbf at its gate; a capacitor 192j provided between internal node 192g and ground voltage node 120 for smoothing the potential change of node 192g; and an inverter stage connected between internal power supply voltage node 140 and ground voltage node 120 for logically inverting a signal potential of internal node 192g (i.e., a charged potential of capacitor 192j).

The inverter stage includes a p-channel MOS transistor 192k connected between internal power supply voltage node 140 and an internal node 192m; a p-channel MOS transistor 192n connected between internal node 192m and an internal node 192p; an n-channel MOS transistor 192q connected between internal node 192p and an internal node 192r; and an n-channel MOS transistor 192s connected between internal node 192r and ground voltage node 120. MOS transistors 192k, 192n, 192q and 192s have their gates connected to internal node 192g.

Timer circuit 192 further includes an inverter circuit 192y receiving a signal from internal node 192p; an inverter circuit 192z receiving an output of inverter 192y; an n-channel MOS transistor 192t connected between internal node 192m and internal node 192p for receiving the output of inverter circuit 192y at its gate; and an n-channel MOS transistor 192x connected between internal node 192p and internal node 192r for receiving the output of inverter circuit 192y at its gate.

Control signal generating circuit 193 includes an NAND circuit 193a receiving timer signal ϕtm and buffer signal ϕbf, and an inverter circuit 193b inverting an output of NAND circuit 193a.

Figure 8:
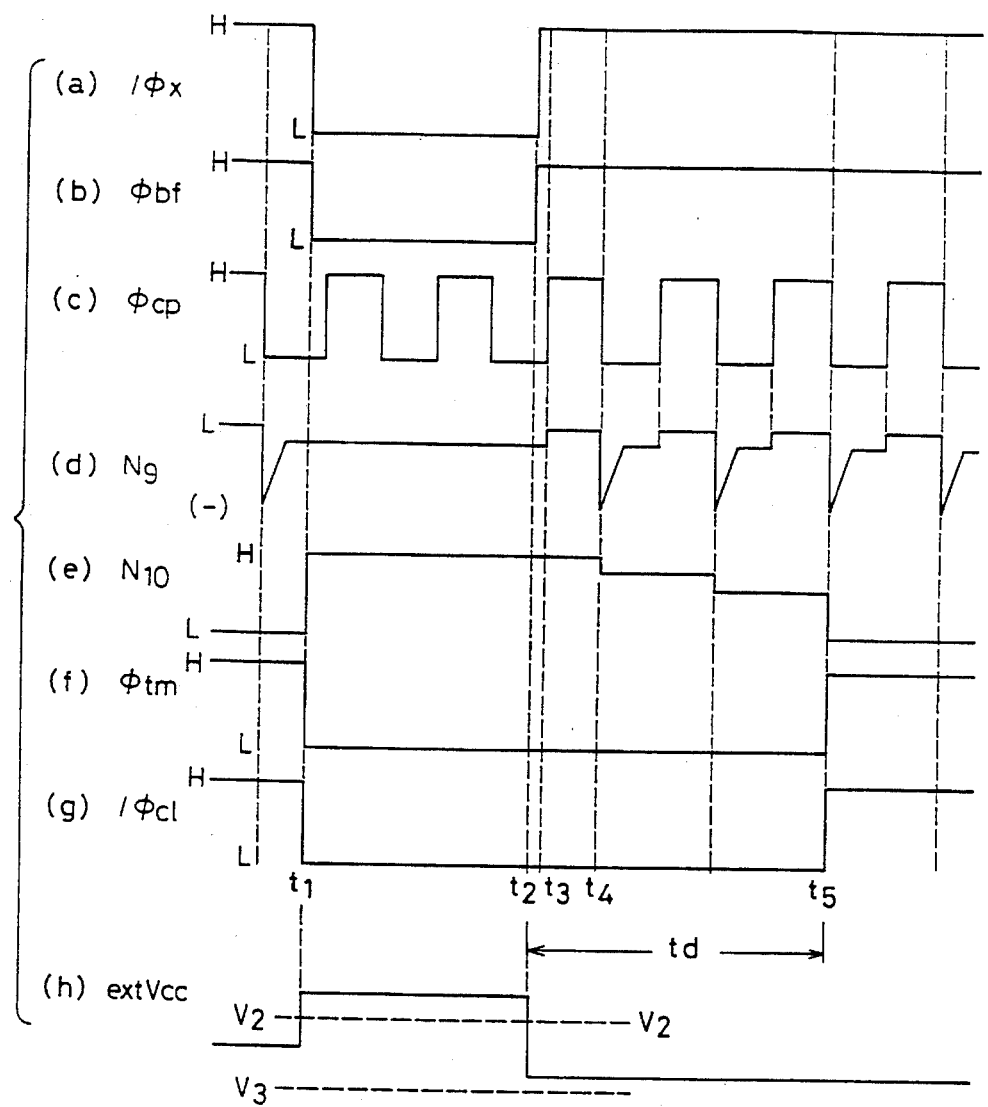
FIG. 8 is a signal waveform showing an operation of the clamp control circuit shown in FIG. 7.

Referring to operating waveforms shown in FIG. 8, operation of clamp control circuit shown in FIG. 7 will be described below.

At time t1, external power supply voltage extVcc is at the normal state of, for example, 5V between voltage levels V2 and V3, while internal power supply voltage intVcc is at a constant voltage level of, for example, 3.3V. In this state, burn-in set signal /ϕx is at the high level (external power supply voltage extVcc level), and p-channel MOS transistor 192e in buffer circuit 191 is turned off. Consequently, internal node 191a is discharged to the ground potential level through resistance 191c so as to attain the low level, while buffer signal ϕbf output from inverter circuit 191d attains the high level of internal power supply voltage intVcc level.

In timer circuit 192, NAND circuit 192a serves as an inverter circuit in response to the high level buffer signal ϕbf for inverting and outputting clock signal ϕcp. An output of NAND circuit 192a is further inverted by inverter circuit 192g to be transmitted to capacitor 192c.

Capacitor 192c causes voltage N9 of node 192d to increase in response to rise of clock signal ϕcp. In responsive to the rise of voltage N9 of node 192d, MOS transistor 192e is turned on, causing the potential of node 192d to decrease. Thus, the potential level of node 192d is clamped at the threshold voltage level of MOS transistor 192e. MOS transistor 192f is turned on in this state because its gate is connected to receive the ground voltage. Also, p-channel MOS transistor 192a is turned off. Consequently, any state change does not occur in internal node 192g in this condition.

If clock signal ϕcp falls, voltage N9 of node 192d decreases due to the capacitive coupling of capacitor 192c. Accordingly, voltage N1 becomes a negative voltage level, MOS transistor 192e is turned off, MOS transistor 192f is turned on, node 192g is connected to node 192d, and its voltage N10 decreases. Since the voltage N10 of node 192g is at the low level, MOS transistors 192m and 192n are turned on and MOS transistors 192q and 192s are turned off, causing an output of inverter circuit 192y to attain the low level and an output of inverter circuit 192z to attain the high level.

In output circuit 193, an output of NAND circuit 193a attains the low level and an output of inverter circuit 193b attains the high level. MOS transistor 192i is turned on responsive to the high level clamping level control signal ϕcl, causing the potential level of node N10 to return the ground potential level.

Consequently, in the normal state, the potential level of node N10 is at the low level.

At time t1, if external power supply voltage extVcc is higher than a predetermined voltage level V2, burn-in set signal /φx falls to the low level. In response to the fall of burn-in set signal /φx to the low level, MOS transistor 191b is turned on, the potential of internal node 191a rises, and buffer signal φbf output from inverter circuit 191t falls to the low level in buffer circuit 191.

In response to the fall of buffer signal φbf, an output of NAND circuit 193a attains the high level and clamping level control signal /φcl output from inverter circuit 193b falls to the low level in output circuit 193.

In response to the fall of buffer signal φbf, an output of NAND circuit 192a is fixed at the high level so that a charge pumping operation in response to clock signal φcp is prohibited in timer circuit 192.

Also, MOS transistor 192i is turned off by clamping level control signal /φcl at the low level and MOS transistor 192h is turned on by the low level buffer signal φbf, causing voltage N10 of node 192g to attain the high level or internal power supply voltage intVcc level.

In response to the increase of voltage N10, MOS transistors 192k and 192n are turned off and MOS transistors 192q and 192s are turned on, causing the potential of node 192p to be discharged to the ground potential level. In response to the potential decrease of node 192p, an output of inverter circuit 192y attains the high level, and timer signal φtm output from inverter circuit 192z falls to the low level. At this time, both MOS transistors 192t and 192x are turned on in response to the high level signal output from inverter circuit 192y, causing node 192m to be discharged at a high speed and MOS transistor 192n to be turned off, and whereby timer signal φtm falls to the low level at high speed.

Upon completion of the burn-in test, external power supply voltage extVcc returns to the normal state at a level not more than predetermined voltage VB level at time t2, causing burn-in set signal /φx to attain the high level (i.e., external power supply voltage extVcc level). In response to the rise of burn-in set signal /φx, MOS transistor 191b is turned off, causing buffer signal φbf to attain the high level (i.e., internal power supply voltage intVcc level). In timer circuit 192 MOS transistor 192h is turned off in response to the rise of buffer signal φbf, and NAND circuit 192a operates as an inverter. At this time t2, clamping level control signal φcl is at the low level and MOS transistor 192i is turned off. MOS transistor 192f remains to be turned off until voltage N9 of internal node 192d becomes a negative voltage. Voltage N10 of internal node 192f keeps the high level (i.e., a charging potential of capacitor 192i). Consequently, even if burn-in set signal /φx rises to the high level at time t2, timer signal φtm is kept at the low level.

If NAND circuit 192a operates as an inverter and clock signal φcp is supplied to capacitor 192c through NAND circuit 192a and inverter circuit 192b, capacitor 192c effects the charge pumping operation. When voltage N9 of node 192d becomes a negative voltage, MOS transistor 192f is turned on and voltage N10 of node 192g (i.e., a charging potential of capacitor 192j) gradually decreases. The voltage reduction speed is determined by the ratio of the product of the capacitance of capacitor 192c and the frequency of clock signal φcp, to the capacitance of capacitor 192g.

When a predetermined time td passes from time t2, voltage N10 of internal node 192g is decreased to the low level, MOS transistors 192m and 192n are turned on, and MOS transistors 192q and 192s are turned off. At this time, whether MOS transistors 192t and 192x are turned on or turned off is determined by the output of inverter circuit 192y. MOS transistors 192m and 192n are turned on at an approximately the same timing while MOS transistors 192q and 192s are turned off at an approximately the same timing. The potential of node 192p is charged by MOS transistors 192m and 192n so as to increase to the high level, the output of inverter circuit 192y attains the low level, and timer signal φtm output from inverter circuit 192z receiving the output of inverter circuit 192y rises to the high level.

In output circuit 193, the output of NAND circuit 193a is fixed at the high level and clamping level control signal /φcl is kept at the high level while timer signal φtm is at the low level. If both buffer signal φbf and timer signal φtm attain the high level, the output of NAND circuit 193a attains the low level and clamping level control signal /φcl output from inverter circuit 193b receiving the output of NAND circuit 193a rises to the high level. In response to clamping level control signal /φcl at the high level, MOS transistor 192i receiving clamping level control signal /φcl at its gate is turned on and voltage N10 of node 192g is discharged to the ground potential level.

A transition of clamping level control signal /φcl to the high level is delayed by a predetermined time td by timer signal φtm because of the following reasons.

When external power supply voltage extVcc at the completion of burn-in test decreases at the completion of burn-in test, internal power supply voltage intVcc decreases accordingly. If external power supply voltage extVcc decreases at high speed, internal power supply voltage intVcc cannot follow this change of external power supply voltage extVcc. Consequently, internal power supply voltage intVcc might be in a vibration state when external power supply voltage extVcc is not greater than the predetermined voltage level V2. When buffer signal φbf is applied as the clamping level control signal, the level of buffer signal φbf changes in response to the level change of internal power supply voltage intVcc, and accordingly the clamping level also changes. At this time, if the boost signal is generated on the boost line, it might be possible that the level of the boost signal changes in response to the change of the clamping level and an unduly high voltage is applied to MOS transistors in the boosting circuit. In order to avoid such state, clamping level control signal φcl is set to the low level for a predetermined time period so that its clamping level can be fixed at intVcc+VthN. This can surely prevent applying the unduly high voltage to MOS transistors in the boosting circuit even if internal power supply voltage intVcc is in the vibration state.

Figure 9:
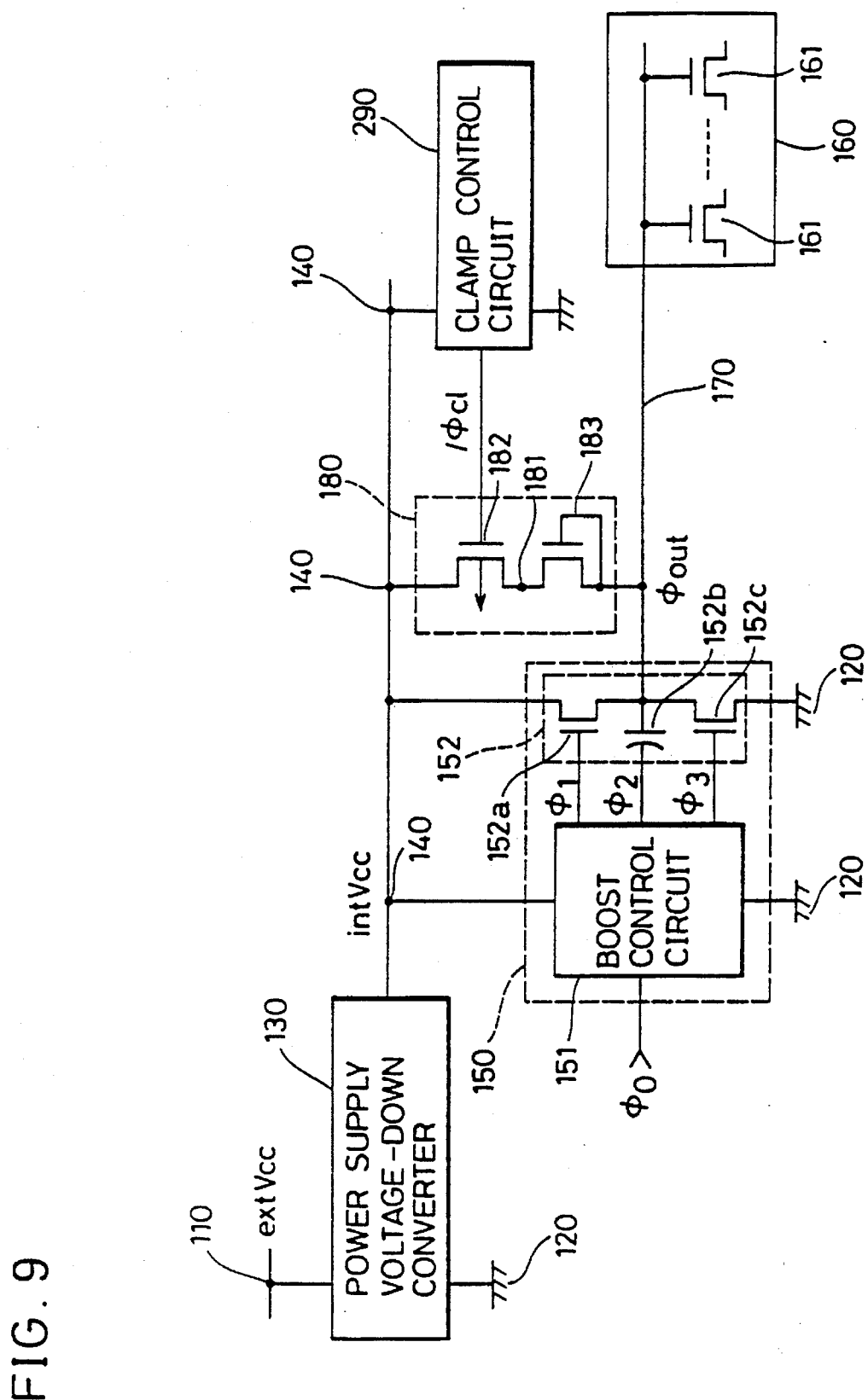
FIG. 9 shows a structure of a main portion of a semiconductor device according to another embodiment of the present invention.

FIG. 9 shows a structure of a main portion of a semiconductor device according to another embodiment of the present invention. In FIG. 9, the same reference numerals are given to components corresponding to components shown in FIG. 1 and the detailed description thereof will not be given in the following.

A clamp control circuit 290 shown in FIG. 9 generates clamping level control signal /φcl in response to the level of internal power supply voltage intVcc. At this time, clamping level control signal /φcl has the hysteresis characteristic in its rising/falling. More particularly, clamping level control signal /φcl changes from the high level or inactive state to the low level or active state when internal power supply voltage intVcc is higher than a first level; and it changes from the low level or active state to the high level or inactive state if internal power supply voltage intVcc is smaller than a second level lower than the first level when internal power supply voltage intVcc decreases from the voltage level higher than the first level.

When internal power supply voltage intVcc is at the level between the first and the second levels, the level of clamping level control signal φcl does not change. In other words, the clamping level of the clamping circuit does not change. The clamping level of the clamping circuit can be changed if internal power supply voltage intVcc is sufficiently decreased when the burn-in test is completed, and thus the reliability of the device will not be impaired. More particularly, the clamping level of the clamping circuit can be stabilized in the transient period after completion of burn-in test.

Also in this transient period, the clamping level of the clamping circuit can be fixed reliably because clamping level control signal /φcl does not change even with the potential change of internal power supply voltage intVcc.

Figure 10:
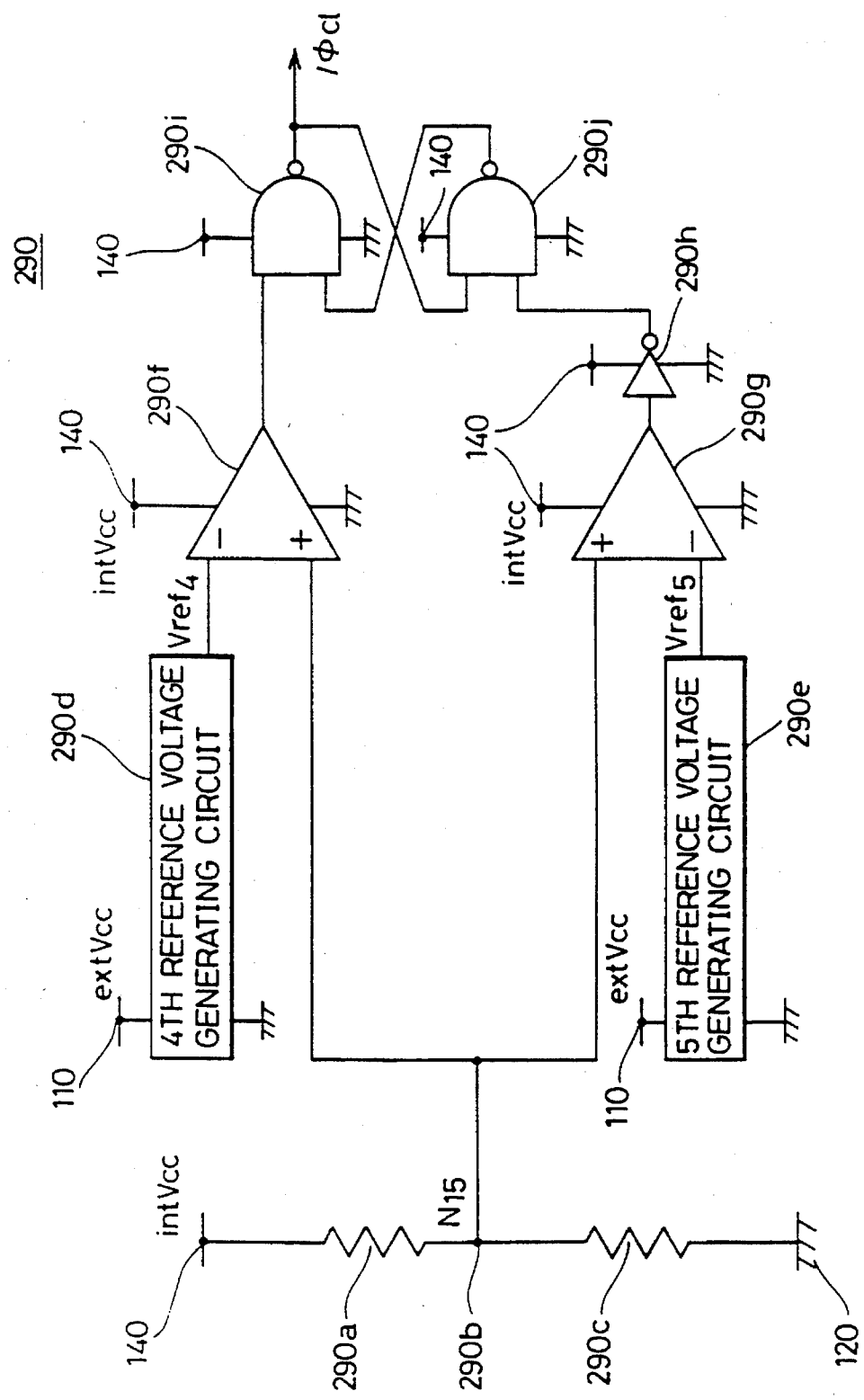
FIG. 10 shows a structure of the clamp control circuit shown in FIG. 9.

FIG. 10 shows a specific structure of the clamp control circuit shown in FIG. 9. In FIG. 10, clamp control circuit 290 includes resistances 290a and 290c serially connected between internal power supply voltage node 140 and ground voltage node 120, and the fourth and the fifth reference voltage generating circuits 290d and 290e generating reference voltages Vref4 and Vref5 respectively. Resistances of 290a and 290c constitute a voltage dividing circuit and voltage N15 expressed by intVcc·R(290c)/(R(290a)+R(290c)) is output at its output 290b, where R(290a) and R(290c) represent resistance values of resistances 290a and 290c, respectively.

The fourth and fifth reference voltage generating circuits 290d and 290e each operate by using external power supply voltage extVcc as one operating power supply voltage, and generates a constant voltage not depending on external power supply voltage extVcc when external power supply voltage extVcc is at least at a predetermined value. A structure of the first reference voltage generating circuit 131 shown in FIG. 4 can apply to the fourth and the fifth reference voltage generating circuits 290d and 290e. Resistance values R1 and R2 are set at suitable values in response to the reference voltage to be generated.

Clamp control circuit 290 further includes a current mirror-type differential amplifying circuit 290f receiving reference voltage Vref output from the fourth reference voltage generating circuit 290d at its negative input and voltage N15 at its positive input; a current mirror-type differential amplifying circuit 290g receiving voltage N15 at its positive input and reference voltage Vref5 output from the fifth reference voltage generating circuit at its negative input; an inverter circuit 290h inverting an output of differential amplifying circuit 290g; and an NAND-type flipflop set in response to an output of differential amplifying circuit 290f and reset in response to an output of inverter circuit 290h.

The NAND-type flipflop includes NAND circuits 290i and 290j having the outputs and the one inputs cross-connected. NAND circuit 290i receives an output of differential amplifying circuit 290f at the other input, and NAND circuit 290j receives an output of inverter circuit 290h at the other input. These circuit elements 290f, 290g, 290h, 290i and 290j each operate by using internal power supply voltage intVcc applied to internal power supply voltage node 140 as one operating power supply voltage. Clamping level control signal /φcl is output from NAND circuit 290i.

Figure 11:
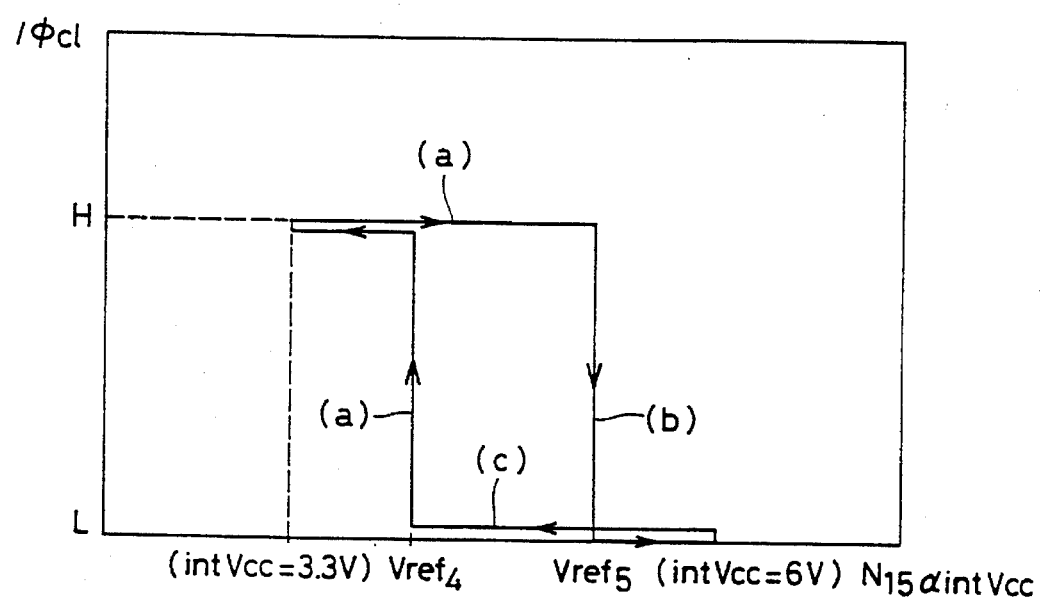
FIG. 11 illustrates an operation of the clamp control circuit shown in FIG. 10.
Figure 12:
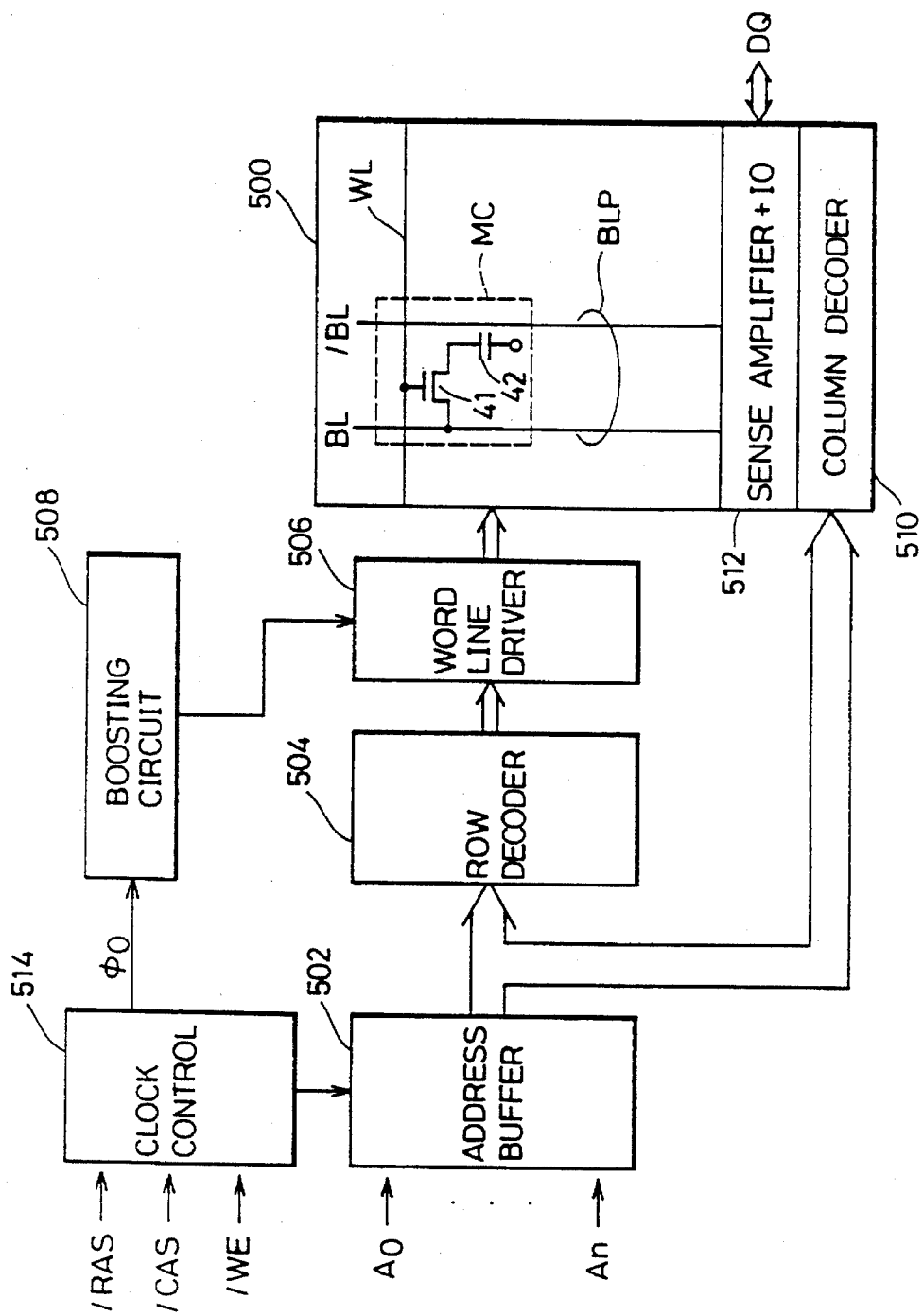
FIG. 12 shows an entire structure of a conventional DRAM.

FIG. 11 shows an operating waveform of the clamp control circuit shown in FIG. 10. In FIG. 11, abscissa indicates voltage N15 appearing at node 290b and ordinate indicates clamping level control signal /φcl.

Voltage N15 appearing at node 290b changes in response to internal power supply voltage intVcc. Both of reference voltages Vref4 and Vref5 generated by the fourth and the fifth reference voltage generating circuits 290d and 290e are constant. Assuming that Vref4<Vref5, if internal power supply voltage intVcc is in the normal operation at, for example, 3.3V, voltage N15 is lower than both reference voltages Vref4 and Vref5. In this state, an output of differential amplifying circuit 290f is at the low level, an output of differential amplifying circuit 290g is at the low level, and an output of inverter circuit 290h is at the high level. Accordingly, clamping level control signal φcl output from NAND circuit 290i is at the high level.

If internal power supply voltage intVcc increases and voltage N15 increases accordingly so as to meet the relation of Vref4<N15<Vref5 (shown by a solid line (a) in FIG. 11), a signal output from differential amplifying circuit 290f is at the high level and a signal output from differential amplifying circuit 290g is at the low level. In this state, clamping level control signal /φcl does not change its level because the high level signal is supplied to the respective other inputs of NAND circuits 290i and 290j.

If voltage N15 is higher than reference voltage Vref5, both outputs of differential amplifying circuits 290f and 290g go to the high level or internal power supply voltage intVcc level and an output of inverter circuit 290h goes to the low level. Accordingly, an output of NAND circuit 290j goes to the high level, causing clamping level control signal /φcl output from NAND circuit 290i to fall to the low level (see a straight line (b) in FIG. 11). After that, clamping level control signal /φcl is kept at the low level during the increase of voltage N15.

Next, the state in which internal power supply voltage intVcc is reduced to attain the relation of Vref4< Vref5 after completion of burn-in test will be considered. In this state, the output state of each of NAND circuits 290i and 290j does not change and clamping level control signal /φcl is kept at the low level (see a straight line (c) in FIG. 11) as in the case of the straight line (a).

If voltage N15 is lower than reference voltage Vref4, an output of differential amplifying circuit 290f goes to the low level, causing clamping level control signal φcl output from NAND circuit 290i to rise to the high level (see a straight line (d) in FIG. 11). Clamping level control signal /φcl output from clamp control circuit 290 shown in FIG. 10 is applied to a gate of p-channel MOS transistor 182 included in clamping circuit 180. Therefore, as in the embodiment shown in FIG. 1, the clamping level of boost signal φout is intVcc+VthN when clamping level control signal /φcl is at the low level, while the clamping level of boost signal φout is intVcc+|VthPI+VthN when clamping level control signal /φcl is at the high level.

As a result, the clamping effect similar to the previous embodiment shown in FIG. 1 can be obtained.

Also, application of an unnecessarily high voltage to the components or MOS transistors can be surely prevented from applying even during the transient period after completion of burn-in test, because control signal /φcl posses a hysteresis characteristic in rising/falling of output or an input-output characteristic with hysteresis.

As described above, according to the present invention, the reliability of components is not impaired even if the overvoltage is applied, because the clamping level which determines the upper limit of the voltage level of the boost signal transmitted on a certain boost line, such as a word line, is made variable depending on the operation modes, i.e., the overvoltage-applied operation mode such as burn-in test and the normal operation mode. Further, the clamping level can be kept stable even during the transient period, because the clamping level control signal is at the fixed level for a predetermined time period after completion of the overvoltage-applied mode of operation.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:

a power supply voltage node receiving a power supply voltage;

boosting means for generating on a boost line a boost potential having a level higher than said power supply voltage;

clamping means for restricting an upper limit of the potential on said boost line to the sum of the power supply voltage and one of a plurality of clamping levels; and clamping level control means for selecting a clamping level of said clamping means.

2. The semiconductor device according to claim 1, further comprising voltage-down means for down-converting an external power supply voltage for generating said power supply voltage, wherein said voltage down means includes determination means for determining whether or not said external power supply voltage is equal to or higher than a predetermined potential level, and wherein said clamping level control means is responsive to a determination result of said determination means.

3. The semiconductor device according to claim 2, wherein said clamping means provides a first clamping level and a second clamping level lower than said first clamping level, and said clamping level control means includes means for designating said second clamping level when said determination means indicates that said external power supply voltage is at least at said predetermined potential level.

4. The semiconductor device according to claim 2, wherein said determination means includes;

first reference voltage generating means for generating a first reference voltage being constant and independent of said external power supply voltage when said external power supply voltage is at least at a first predetermined value, second reference voltage generating circuit for generating a second reference voltage changing with said external power supply voltage, when said external power supply voltage is at least at a second predetermined value, and comparing means comparing said first reference voltage and said second reference voltage.

5. The semiconductor device according to claim 1, wherein said clamping means includes;

a diode-connected first insulating gate-type field effect transistor connected to said boost line, and a second insulating gate-type field effect transistor connected between said first insulating gate-type field effect transistor and said power supply voltage node, and said clamping level control means includes means for selectively setting a potential of a gate electrode of said second insulating gate-type field effect transistor.

6. The semiconductor device according to claim 5, wherein said first insulating gate-type field effect transistor includes an n-channel transistor, and said second insulating gate-type field effect transistor includes a p-channel transistor.

7. The semiconductor device according to claim 1, further comprising voltage-down means for down-converting the external power supply voltage for generating a power supply voltage, wherein said clamping level control means includes means for rendering active a clamping level control signal when said external power supply voltage is equal to or higher than a first predetermined value, and for rendering inactive said clamping level control signal a predetermined time after said external power supply voltage is at said first predetermined value or less when said external power supply voltage changes from a level of said first predetermined value or more to a level of said first predetermined value or less, and wherein said clamping means provides a first clamping level when said clamping level control signal is inactive and provides a second clamping level lower than said first clamping level when said clamping level control signal is active.

8. The semiconductor device according to claim 1, wherein said clamping level control means includes means for rendering active a clamping level control signal when said power supply voltage is at least at a first level, and for rendering inactive said clamping level control signal when said power supply voltage changes from said first level to a second level lower than said first level, and wherein said clamping means provides a first clamping level when said clamping level control signal is inactive, and provides a second clamping level lower than said first clamping level when said clamping level control signal is active.

9. The semiconductor device according to claim 8, wherein said clamping level control means further includes;

voltage dividing means resistively dividing said power supply voltage, first comparing means for comparing an output of said voltage dividing means and a first reference voltage, second comparing means for comparing an output of said voltage dividing means and a second reference voltage higher than said first reference voltage, and logically inverting and outputting the result of comparison, and a flipflop receiving an output of said first comparing means and an output of said second comparing means, respectively, at one and another inputs thereof.

10. The semiconductor device according to claim 1, wherein said clamping means includes;

a diode-connected n-channel MOS transistor connected to said boost line, and a p-channel MOS transistor connected between said n-channel MOS transistor and said power supply voltage node, and said clamping level control means includes;

voltage dividing means for resistively dividing said power supply voltage, first comparing means receiving an output of said voltage dividing means at a positive input thereof and a first reference voltage at a negative input thereof, second comparing means receiving the output of said voltage dividing means at a positive input thereof and a second reference voltage higher than said first reference voltage at a negative input thereof, inverting means for logically inverting an output of said second comparing means, a first NAND gate receiving an output of said inverting means at one input, and a second NAND gate receiving an output of said first comparing means at one input, and an output of said first NAND gate at another input for applying that output to another input of said first NAND gate, said second NAND gate having an output applied to a gate of said p-channel MOS transistor.

11. The semiconductor device according to claim 1, further comprising:

voltage-down means for down-converting an external power supply voltage higher than said power supply voltage for generating said power supply voltage, first reference voltage generating means for generating a first reference voltage having a constant potential level independent of said external power supply voltage, second reference voltage generating means for generating a second reference voltage changing depending on said external power supply voltage, differential amplifying means receiving said first reference voltage at a positive input thereof and said second reference voltage at a negative input thereof, and wherein said clamping means includes a diode-connected n-channel MOS transistor connected to said boost line, a p-channel MOS transistor connected between said n-channel MOS transistor and said power supply voltage node, and said clamping level control means includes;

control signal generating means for generating a control signal falling to a low level in response to a transition of an output of said differential amplifying means from a high level to a low level, and rising from the low level to the high level after a predetermined time after rising of the output of said differential amplifying means from the low level to the high level, for applying the control signal to a gate of said p-channel MOS transistor.

12. The semiconductor device according to claim 11, wherein said differential amplifying means operates using said external power supply voltage as one operating power supply voltage, and said control signal generating means includes; level converting means for converting a high level of the output of said differential amplifying means to said power supply voltage level, timer means operating with said power supply voltage as an operating power supply voltage for delaying rising of an output of said level converting means from a low level to a high level by a predetermined time period, and output means for producing an logical product of the output of said level converting means and an output of said timer means for generating said control signal.

13. The semiconductor device according to claim 12, wherein said timer means includes;

a first capacitor means, inverting means for inverting in logic a charging potential of said capacitor means, gate means for passing a clock signal having a predetermined period when the output of said level converting means is at the high level, charging means responsive to an output of a low level of said level converting means for charging said first capacitor means, and charge pumping means responsive to an output of said gate means for discharging a charging potential of said first capacitor means by charge pumping operation.

14. A semiconductor device, comprising:

an external power supply voltage node receiving an external power supply voltage;

a power supply voltage-down means for down-converting the external power supply voltage from said external power supply voltage node for generating an internal power supply voltage and an internal power supply voltage node;

boosting means receiving the internal power supply voltage from said internal power supply voltage node for outputting a boost potential higher than said internal power supply voltage on a boost line, and clamping means for restricting an upper limit of the potential of said boost line to the sum of the internal power supply voltage and one of a plurality of clamping levels.

15. A semiconductor device, comprising:

clamp control means for rendering active a clamping level control signal when a power supply voltage is at least at a first voltage level during an increase of said power supply voltage, and for rendering inactive said clamping level control signal a predetermined time after said power supply voltage attains said first voltage or less during a decrease of said power supply voltage; and clamping means connected to a boost line boosted to a voltage higher than said power supply voltage and responsive to the clamping level control signal from said clamp control means, for restricting an upper limit of the potential said boost line to the sum of the power supply voltage and one of a plurality of clamping levels, said clamping means including means for selecting a prescribed clamping level and for decreasing said prescribed clamping level when the clamping level control signal from said clamp control means is rendered active.

16. A semiconductor device, comprising:

clamp control means for rendering active a clamping level control signal when a power supply voltage is at least at a first voltage during an increase of a power supply voltage, and for rendering said clamping level control signal inactive when said power supply voltage attains a second voltage lower than said first voltage or less during a decrease of said power supply voltage; and clamping means connected to a boost line boosted to a voltage higher than said power supply voltage and responsive to the clamping level control signal from said clamp control means for restricting an upper limit of the potential of said boost line to the sum of the power supply voltage and one of a plurality of clamping levels, said clamping means including means for selecting a prescribed clamping level and for decreasing said prescribed clamping level when the clamping level control signal from said clamp control means is rendered active.

17. A method for clamping a voltage on a boost line on which a boost signal having a voltage level higher than a power supply voltage supplied to a power supply voltage node is transmitted, comprising the steps of:

clamping an upper limit of a voltage of said boost line to first level during an overvoltage-applied mode of operation when a voltage applied to said power supply voltage node is set to a voltage higher than that in a normal operation mode; and clamping an upper limit of the voltage of said boost line to a second level when the voltage supplied to said power supply voltage node is equal to the voltage supplied thereto during the normal operation mode, so that a difference between said first level and said power supply voltage is less than that between said second level and said power supply voltage.

18. The semiconductor device according to claim 1, wherein said plurality of clamping levels include a first clamping level and a second clamping level lower than said first clamping level, and said clamping level control means includes means for selecting said second clamping level when an operation mode in which said power supply voltage is made higher than in a normal operation mode is designated.

19. A semiconductor device to which is applied a power supply voltage of a first level for operating said semiconductor device in a normal operating mode and to which is applied a power supply voltage of a second level greater than the first level for operating the semiconductor device in a test operating mode, the semiconductor device comprising:

a power supply voltage node for receiving the power supply voltage of the first or second level;

boosting means for applying on a boost line a boost potential of a level higher than the level of the power supply voltage applied on said power supply voltage node;

clamping means for restricting an upper limit of the potential of boost line to the sum of the power supply voltage and one of a plurality of clamping levels; and clamping control means, responsive to a signal for operating said semiconductor device in the test mode for selecting a clamping level of said clamping means.

20. The device of claim 19, wherein said test operating mode corresponds to a burn-in test of said semiconductor device.

21. The device of claim 19, wherein said upper limit is higher than a level of the power supply voltage applied to said power supply voltage node.

22. A semiconductor device comprising:

a power supply voltage node receiving a power supply voltage;

a boost node receiving a boosted voltage higher than the voltage on said power supply voltage node, an n channel insulated gate transistor having one conduction terminal and a control gate connected together to said boost node, and another conduction terminal;

a p channel insulated gate type transistor having one conduction terminal coupled to the other conduction terminal of said n channel insulated gate type transistor, another conduction terminal coupled to said power supply voltage node, and a control gate receiving a mode control signal having a high level of said voltage on said power supply voltage node and a low level of a ground level, such that the boost node is clamped at levels above the level of said power supply voltage.

* * * * *